(12) United States Patent
Tajima et al.

(10) Patent No.: US 11,270,934 B2
(45) Date of Patent: Mar. 8, 2022

(54) SEMICONDUCTOR DEVICE AND METHOD FOR MANUFACTURING SAME (71) Applicants: KABUSHIKI KAISHA TOSHIBA, Minato-ku (JP); KIOXIA CORPORATION, Minato-ku (JP)

(72) Inventors: Takayuki Tajima, Sagamihara (JP); Kazuo Shimokawa, Yokohama (JP)

(73) Assignees: KABUSHIKI KAISHA TOSHIBA, Minato-ku (JP); KIOXIA CORPORATION, Minato-ku (JP)

( * ) Notice: Subject to any disclaimer, the term of this patent is extended or adjusted under 35 U.S.C. 154(b) by 0 days.

(21) Appl. No.: 16/257,100

(22) Filed: Jan. 25, 2019

(65) Prior Publication Data

US 2019/0287895 A1 Sep. 19, 2019

(30) Foreign Application Priority Data

Mar. 13, 2018 (JP) .............................. JP2018-045555

(51) Int. Cl.
*H01L 23/522* (2006.01)
*H01L 25/065* (2006.01)
(Continued)

(52) U.S. Cl.
CPC ........ *H01L 23/5226* (2013.01); *H01L 21/561* (2013.01); *H01L 21/566* (2013.01); *H01L 23/3128* (2013.01); *H01L 23/5228* (2013.01); *H01L 23/5283* (2013.01); *H01L 23/53228* (2013.01); *H01L 23/53257* (2013.01); *H01L 24/17* (2013.01); *H01L 24/96* (2013.01); *H01L 25/0655* (2013.01); *H01L 23/5384* (2013.01);
(Continued)

(58) Field of Classification Search
CPC ............ H01L 23/5383; H01L 23/5384; H01L 23/5386; H01L 23/5226; H01L 24/04; H05K 1/113; H05K 1/116
See application file for complete search history.

(56) References Cited

U.S. PATENT DOCUMENTS 6,380,065 B1 4/2002 Komai et al.
8,058,563 B2 * 11/2011 Sakamoto ........... H01L 21/4857
174/255
(Continued)

FOREIGN PATENT DOCUMENTS

JP 2000-150647 5/2000
JP 2007-150647 6/2007
(Continued)

*Primary Examiner* — David A Zarneke
(74) *Attorney, Agent, or Firm* — Oblon, McClelland, Maier & Neustadt, L.L.P.

(57) ABSTRACT

A semiconductor device includes a redistribution layer, a bump bonded to a first surface of the redistribution layer, and a chip bonded to a second surface of the redistribution layer. The redistribution layer includes an insulating layer, a conductive member connecting the bump to the chip and being provided inside the insulating layer, a bonding electrode connected between the conductive member and the bump, and a conductive layer provided between the insulating layer and the conductive member and between the bonding electrode and the conductive member. A resistivity of the conductive member is lower than a resistivity of the conductive layer.

5 Claims, 10 Drawing Sheets

(51) Int. Cl.
*H01L 23/00* (2006.01)
*H01L 23/31* (2006.01)
*H01L 21/56* (2006.01)
*H01L 23/532* (2006.01)
*H01L 23/528* (2006.01)
*H05K 1/11* (2006.01)
*H01L 23/538* (2006.01)

(52) U.S. Cl.
CPC ...... *H01L 24/04* (2013.01); *H01L 2224/0231* (2013.01); *H01L 2224/02373* (2013.01); *H05K 1/113* (2013.01); *H05K 1/116* (2013.01)

(56) References Cited

U.S. PATENT DOCUMENTS

| | | | | |
|---|---|---|---|---|
| 8,124,524 B2* | 2/2012 | Choi | ................ | H01L 21/76846 |
| | | | | 438/627 |
| 8,259,464 B2* | 9/2012 | Zhou | ................ | H01L 23/3171 |
| | | | | 361/771 |
| 8,617,987 B2* | 12/2013 | Gan | ................ | H01L 24/19 |
| | | | | 438/667 |
| 8,704,367 B2* | 4/2014 | Migita | ................ | H01L 24/03 |
| | | | | 257/737 |
| 9,578,756 B2* | 2/2017 | Nishioka | ................ | H05K 3/4644 |
| 9,997,471 B2* | 6/2018 | Hung | ................ | H01L 25/50 |
| 10,020,263 B2* | 7/2018 | Lee | ................ | H01L 23/31 |
| 10,163,801 B2* | 12/2018 | Chang | ................ | H01L 21/566 |
| 10,297,544 B2* | 5/2019 | Wu | ................ | H01L 21/76802 |
| 10,438,899 B2* | 10/2019 | Kim | ................ | H01L 24/10 |
| 10,615,115 B2* | 4/2020 | Inohara | ................ | H01L 23/5226 |
| 10,796,997 B2* | 10/2020 | Lee | ................ | H01L 21/6835 |
| 2009/0175023 A1 | 7/2009 | Sakamoto et al. | | |
| 2011/0104858 A1 | 5/2011 | Katagiri et al. | | |
| 2016/0174375 A1 | 6/2016 | Mizushima | | |
| 2019/0267350 A1 | 8/2019 | Tajima et al. | | |

FOREIGN PATENT DOCUMENTS

| | | |
|---|---|---|
| JP | WO 2009/084301 | 7/2009 |
| JP | 5249173 | 4/2013 |
| JP | 2016-115799 | 6/2016 |
| JP | 2019-149507 A | 9/2019 |

* cited by examiner

FIG. 10

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2018-045555, filed on Mar. 13, 2018; the entire contents of which are incorporated herein by reference.

FIELD

Embodiments relate to a semiconductor device and a method for manufacturing the same.

BACKGROUND

Conventionally, a semiconductor device is manufactured in which memory chips are multiply stacked on a printed circuit board and molded using a resin. Bumps are bonded to the lower surface of the printed circuit board; and the semiconductor device is mounted via the bumps to an electronic device, etc. On the other hand, due to requirements for thinner semiconductor devices of recent years, technology has been proposed in which a redistribution layer is used instead of the printed circuit board. In the redistribution layer, a conductive member that is made of copper (Cu) is buried inside an insulating layer made of an organic material. However, the adhesion between the insulating layer and the conductive member is poor; and the conductive member may peel from the insulating layer if warp of the redistribution layer occurs, etc.

BRIEF DESCRIPTION OF THE DRAWINGS

FIGS. 3A to 9 are cross-sectional views showing a method for manufacturing the semiconductor device according to the embodiment.

DETAILED DESCRIPTION

A semiconductor device according to one embodiment includes a redistribution layer, a bump bonded to a first surface of the redistribution layer, and a chip bonded to a second surface of the redistribution layer. The redistribution layer includes an insulating layer, a conductive member connecting the bump to the chip and being provided inside the insulating layer, a bonding electrode connected between the conductive member and the bump, and a conductive layer provided between the insulating layer and the conductive member and between the bonding electrode and the conductive member. A resistivity of the conductive member is lower than a resistivity of the conductive layer.

A method for manufacturing a semiconductor device according to one embodiment includes forming a first insulating layer on a support substrate. A first opening is formed in the first insulating layer. The method includes forming a bonding electrode inside the first opening. The method includes forming a first conductive layer on an inner surface of the first opening. The method includes forming a first pattern on the first insulating layer. A second opening is formed in the first pattern and communicates with the first opening. The method includes forming a first conductive member inside the first opening and inside the second opening. The first conductive member has a lower resistivity than the first conductive layer. The method includes removing the first pattern. The method includes forming a second insulating layer on the first insulating layer. The second insulating layer covers the first conductive member. A third opening is formed in the second insulating layer and reaches the first conductive member. The method includes forming a second conductive member inside the third opening. The method includes connecting a chip to the second conductive member. The method includes removing the support substrate. The method includes connecting a bump to an exposed surface of the first conductive member.

An embodiment will now be described.

Figure 1:
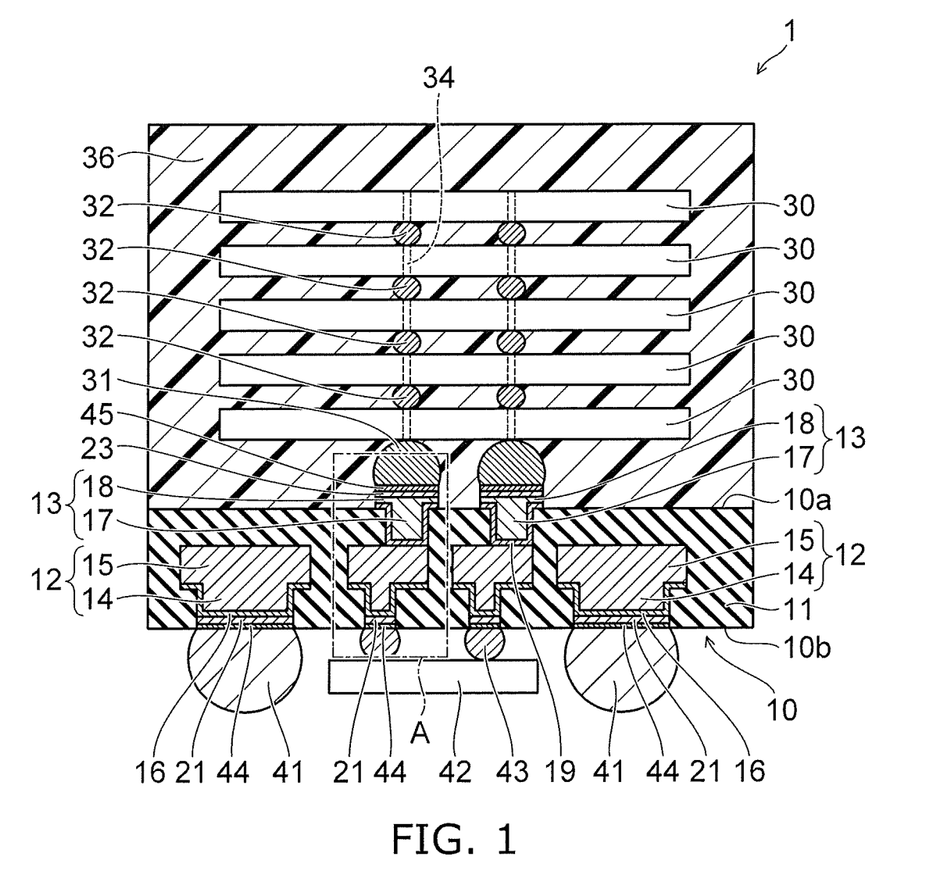
FIG. 1 is a cross-sectional view showing a semiconductor device according to an embodiment.

FIG. 1 is a cross-sectional view showing a semiconductor device according to the embodiment.

Figure 2:
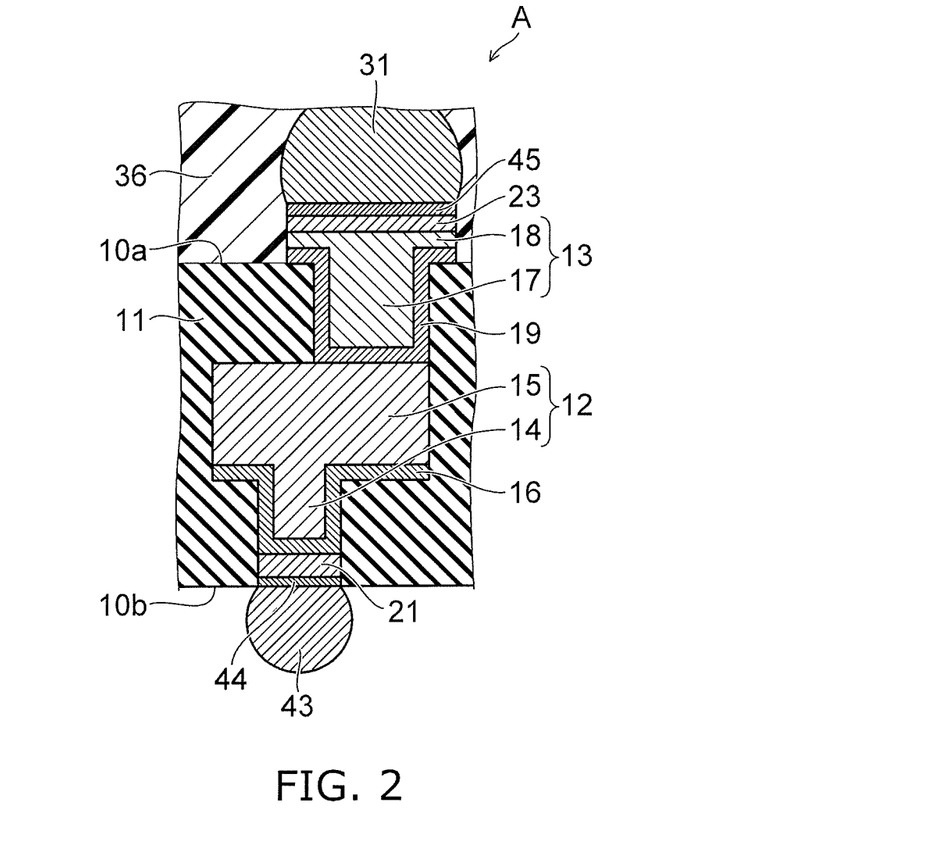
FIG. 2 is a partially enlarged cross-sectional view showing region A of FIG. 1.

FIG. 2 is a partially enlarged cross-sectional view showing region A of FIG. 1.

As shown in FIG. 1 and FIG. 2, a redistribution layer 10 is provided in the semiconductor device 1 according to the embodiment. In the redistribution layer 10, for example, an insulating layer 11 that is made of an organic material is provided as a main material; and a lower conductive member 12 and an upper conductive member 13 are provided inside the insulating layer 11. For example, the lower conductive member 12 and the upper conductive member 13 are formed of a metal material such as copper, etc. The lower conductive member 12 is disposed in a lower level of the redistribution layer 10; and the upper conductive member 13 is disposed in an upper level of the redistribution layer 10.

The lower portion of the lower conductive member 12 is a via 14; and the upper portion of the lower conductive member 12 is an interconnect 15. The via 14 and the interconnect 15 are formed as one body. The via 14 extends in the vertical direction; and the interconnect 15 extends in the horizontal direction. A titanium (Ti) layer 16 is provided as a first conductive layer continuous on the lower surface of the via 14, on the side surface of the via 14, and on the lower surface of the interconnect 15. The lower conductive member 12 and the titanium layer 16 are disposed inside the insulating layer 11. Accordingly, the titanium layer 16 is interposed between the via 14 and the insulating layer 11. The titanium layer 16 is interposed also between the insulating layer 11 and the lower surface of the interconnect 15.

The lower portion of the upper conductive member 13 is a via 17; and the upper portion of the upper conductive member 13 is an electrode 18. The via 17 and the electrode 18 are formed as one body. The via 17 extends in the vertical direction; and the electrode 18 spreads along a horizontal plane. A titanium layer 19 is provided as a second conductive layer on the lower surface of the via 17, on the side surface of the via 17, and on the lower surface of the electrode 18. The via 17 is connected to the interconnect 15 via the titanium layer 19. Accordingly, the via 17 is connected to the via 14 via the interconnect 15. Generally, the position of the via 17 is different from the position of the via 14 when viewed from above; but an overlapping portion may be provided.

The via 17 and the portion of the titanium layer 19 covering the via 17 are disposed inside the insulating layer 11. On the other hand, the electrode 18 and the portion of the titanium layer 19 provided on the lower surface of the electrode 18 are disposed outside the insulating layer 11, that is, on the insulating layer 11. Accordingly, the titanium layer 19 is interposed between the via 17 and the insulating layer 11. On the other hand, the electrode 18 is separated from the insulating layer 11.

A nickel (Ni) layer 21 and a nickel layer 23 are further provided in the redistribution layer 10. The nickel layer 21 is provided on the lower surface of the via 14 with the titanium layer 16 interposed. The nickel layer 21 is disposed inside the insulating layer 11. The nickel layer 23 is disposed on the upper surface of the electrode 18.

Thereby, the nickel layer 21, the titanium layer 16, the via 14, the interconnect 15, the titanium layer 19, the via 17, the electrode 18, and the nickel layer 23 are connected in series in this order upward from the bottom.

Also, in the semiconductor device 1, multiple semiconductor chips 30 are provided on an upper surface 10a of the redistribution layer 10 and are stacked along the vertical direction. The semiconductor chips 30 are, for example, three-dimensional NAND memory chips. The nickel layer 23 of the redistribution layer 10 and the semiconductor chip 30 of the lowermost level are bonded via a micro-bump 31. An intermetallic compound layer 45 is formed between the nickel layer 23 and the micro-bump 31. The mutually-adjacent semiconductor chips 30 are bonded to each other via micro-bumps 32. In the specification, "bonded" refers to a state of being mechanically linked and electrically connected. Through-vias 34 are provided inside each of the semiconductor chips 30 and transmit signals input from the redistribution layer 10 via the micro-bump 31 or 32 below the semiconductor chip 30 to memory cells formed in the upper layer portion of the semiconductor chip 30 and to the semiconductor chips 30 in levels above the semiconductor chip 30.

A resin member 36 is provided on the upper surface 10a of the redistribution layer 10. The resin member 36 is made from a resin material and covers the stacked semiconductor chips 30 and the micro-bumps 31 and 32.

In the semiconductor device 1, a bump 41 is provided on a lower surface 10b of the redistribution layer 10. For example, the bump 41 is made from solder; and the diameter of the bump 41 is larger than the diameters of the micro-bumps 31 and 32, e.g., several hundred μm. The bump 41 is disposed under the nickel layer 21 and is bonded to the nickel layer 21 via an intermetallic compound layer 44. The intermetallic compound layers 44 and 45 include, for example, nickel, tin (Sn), and copper, and include, for example, $Ni_3Sn_4$, $Cu_6Sn_5$, $Cu_3Sn$, etc. The thicknesses of the intermetallic compound layers 44 and 45 are dependent on the time and the temperature of the bonding but are substantially about 1 μm. The intermetallic compound layers 44 and 45 can be detected by cross section observation by SEM or by cross section observation and composition analysis by EDX.

A control chip 42 is mounted on the lower surface 10b of the redistribution layer 10. The control chip 42 is bonded to the nickel layer 21 of the redistribution layer 10 via a micro-bump 43. In other words, a portion of the multiple nickel layers 21 is bonded to the bump 41; and another portion of the multiple nickel layers 21 is bonded to the micro-bump 43. A resin member that covers the micro-bump 43 may be provided between the redistribution layer 10 and the control chip 42.

In the semiconductor device 1, electrodes (not illustrated) of the semiconductor chips 30 are connected to the outside via the micro-bumps 32 and 31, the nickel layer 23, the electrode 18, the via 17, the titanium layer 19, the interconnect 15, the via 14, the titanium layer 16, the nickel layer 21, and the bump 41. For example, the control chip 42 functions as an interface controlling the transmission of the signals between the multiple semiconductor chips 30 and the outside, and functions as a controller controlling the operations of these semiconductor chips 30.

A method for manufacturing the semiconductor device according to the embodiment will now be described.

FIGS. 3A to 3D, FIGS. 4A to 4D, FIGS. 5A to 5D, FIGS. 6A to 6C, FIGS. 7A to 7C, FIGS. 8A to 8C, and FIG. 9 are cross-sectional views showing the method for manufacturing the semiconductor device according to the embodiment.

Figure 10:
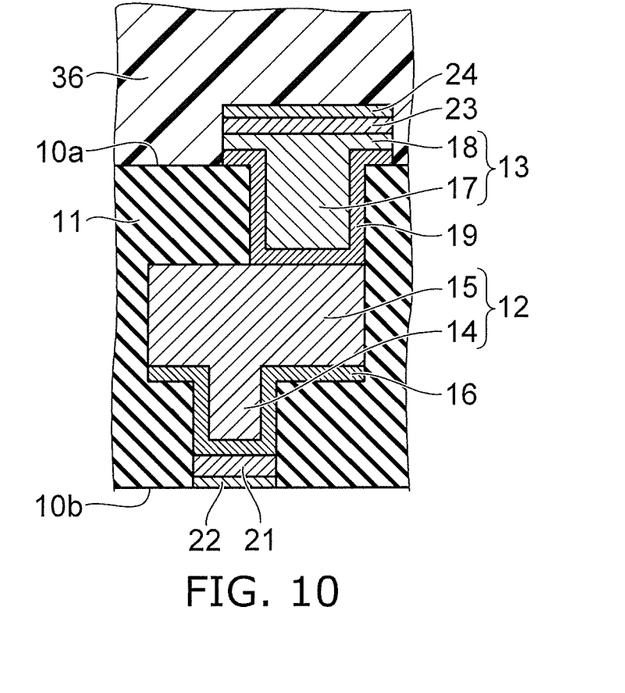
FIG. 10 is a partially enlarged cross-sectional view showing the method for manufacturing the semiconductor device according to the embodiment.

FIG. 10 is a partially enlarged cross-sectional view showing the method for manufacturing the semiconductor device according to the embodiment.

However, FIG. 10 is a reference drawing supplementing the description; and there is no point in time in the manufacturing method described in the embodiment when the intermediate structure body has the state shown in FIG. 10. In other words, a gold layer 22 and a gold layer 24 do not exist simultaneously.

Figure 3A:
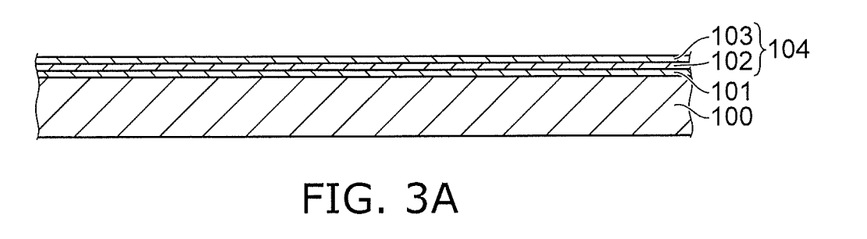

First, a support substrate 100 is prepared as shown in FIG. 3A. The support substrate 100 is, for example, a silicon wafer or a glass substrate. Then, a release layer 101 is formed on the upper surface of the support substrate 100. The release layer 101 is, for example, an organic material dissolvable in a designated chemical liquid, an organic material in which a decomposition reaction is caused by light irradiation, or an organic material or an inorganic material for which peeling is caused by stress application of a constant amount or more. Then, a titanium layer 102 is formed on the release layer 101; and a copper layer 103 is formed on the release layer 101. The adhesion is high between the titanium layer 102 and the release layer 101. A seed layer 104 includes the titanium layer 102 and the copper layer 103.

Figure 3B:
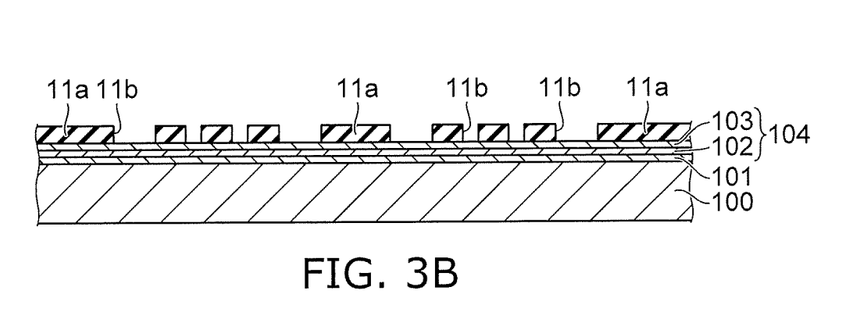

Then, as shown in FIG. 3B, for example, an insulating layer 11a that is made of an organic material is formed on the seed layer 104. Then, for example, via holes 11b are formed in the insulating layer 11a by lithography or laser irradiation. The seed layer 104 is exposed at the bottom surfaces of the via holes 11b.

Figure 3C:
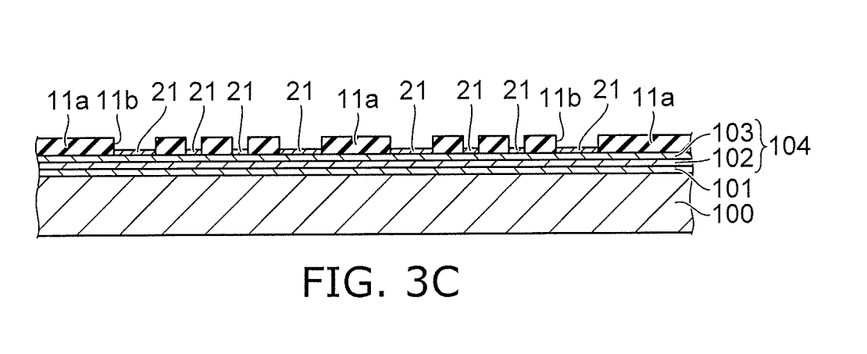

Continuing as shown in FIG. 3C, nickel is deposited by performing electroplating via the seed layer 104. Thereby, the nickel layer 21 is formed on the seed layer 104 inside the via holes 11b. At this time, because the conductivity of the copper layer 103 is high, this is beneficial for increasing the uniformity of the plating thickness in the case where the resist pattern is disposed in a wide area.

Figure 3D:
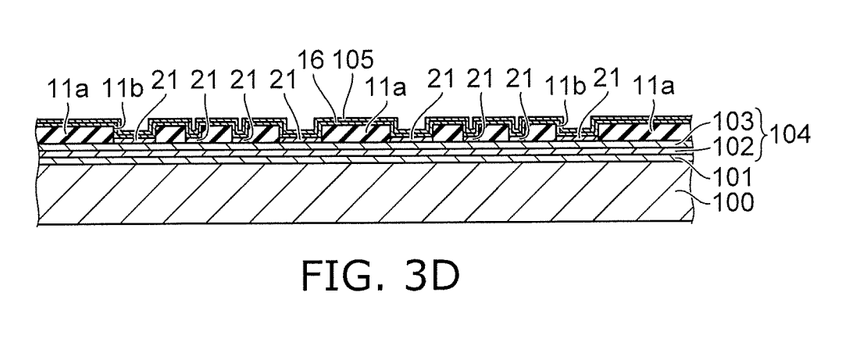

Then, as shown in FIG. 3D, for example, the titanium layer 16 is formed by depositing titanium on the entire surface by sputtering. Then, for example, a copper layer 105 is formed by depositing copper on the entire surface by sputtering. The titanium layer 16 and the copper layer 105 are formed to be continuous on the upper surface of the insulating layer 11a and on the inner surfaces of the via holes 11b.

Figure 4A:
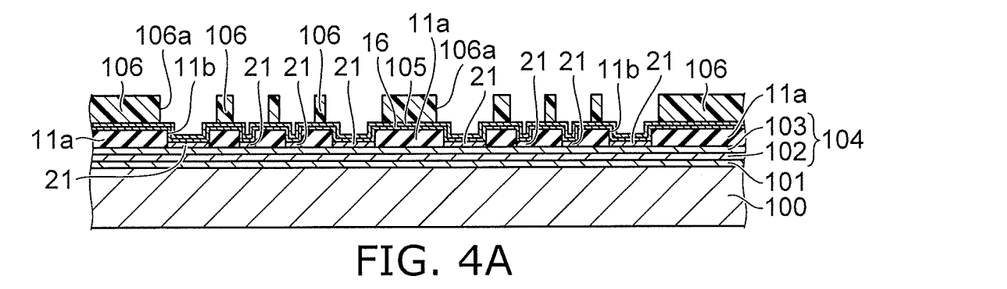

Continuing as shown in FIG. 4A, a resist pattern 106 is formed on the copper layer 105. Openings 106a are formed in the resist pattern 106 by lithography. The via holes 11b are positioned at the bottom surfaces of the openings 106a. Thereby, the openings 106a communicate with the via holes 11b.

Figure 4B:
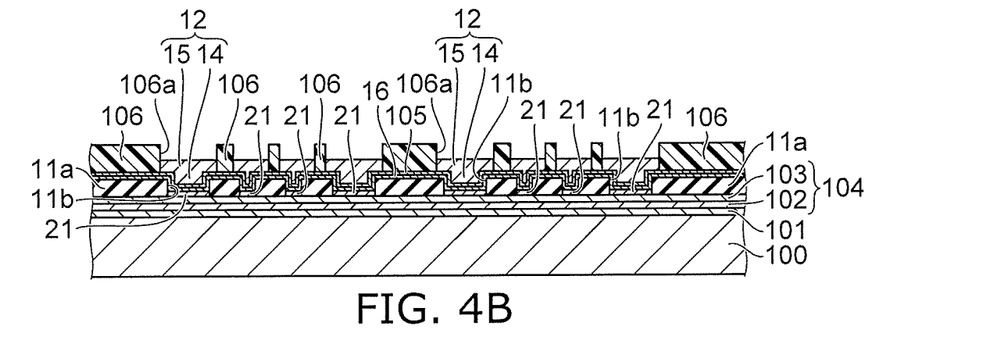

Then, as shown in FIG. 4B, the lower conductive member 12 is formed by electroplating copper via the copper layer 105. The portion of the lower conductive member 12 filled into the via hole 11b is used to form the via 14; and the portion of the lower conductive member 12 filled into the opening 106a is used to form the interconnect 15. The via 14 is connected to the nickel layer 21 via the titanium layer 16.

Figure 4C:
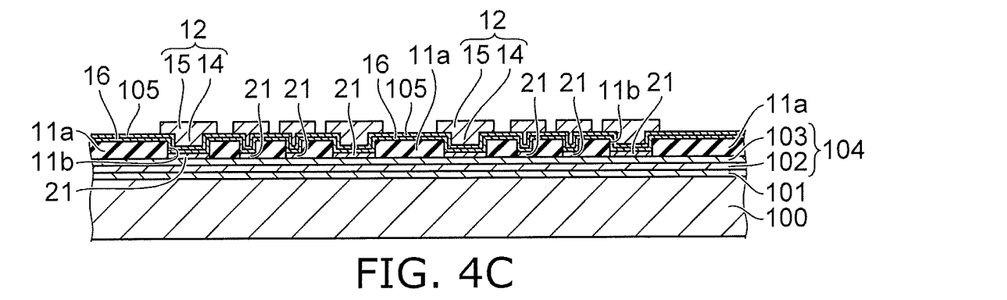

Continuing as shown in FIG. 4C, the resist pattern 106 is removed. Thereby, the portion of the copper layer 105 covered with the resist pattern 106 is exposed.

Figure 4D:
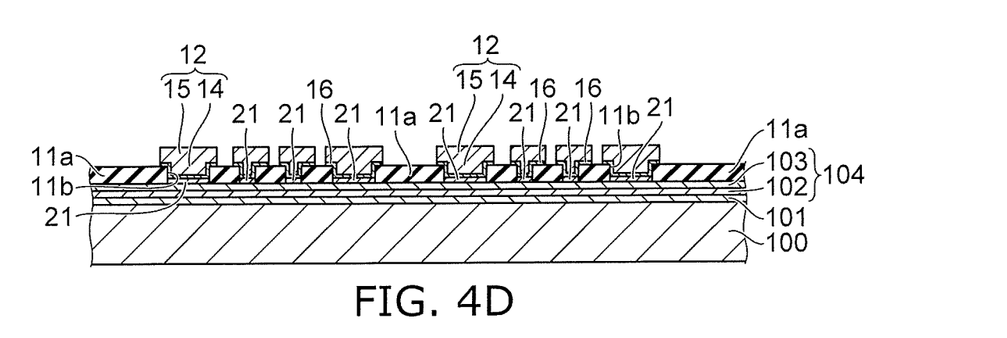

Then, as shown in FIG. 4D, for example, the portions of the copper layer 105 and the titanium layer 16 not covered with the lower conductive member 12 are removed by etching. As a result, the insulating layer 11a is exposed again. On the other hand, the portions of the copper layer 105 and the titanium layer 16 covered with the lower conductive member 12 remain. The portion of the copper layer 105 covered with the lower conductive member 12 is formed as one body with the lower conductive member 12 and is therefore shown as a portion of the lower conductive member 12 hereinbelow.

Figure 5A:
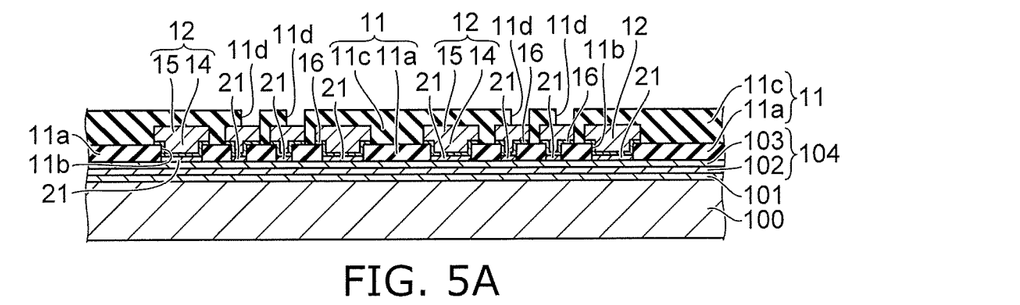

Continuing as shown in FIG. 5A, for example, an insulating layer 11c that is made of an organic material is formed on the insulating layer 11a and the lower conductive member 12. The insulating layer 11 is formed of the insulating layer 11a and the insulating layer 11c. Then, for example, via holes 11d are formed in the insulating layer 11c by lithography or laser irradiation. The interconnect 15 of the lower conductive member 12 is exposed at the bottom surfaces of the via holes 11d. Hereinbelow, the insulating layer 11a and the insulating layer 11c are shown as the insulating layer 11 without differentiating.

Figure 5B:
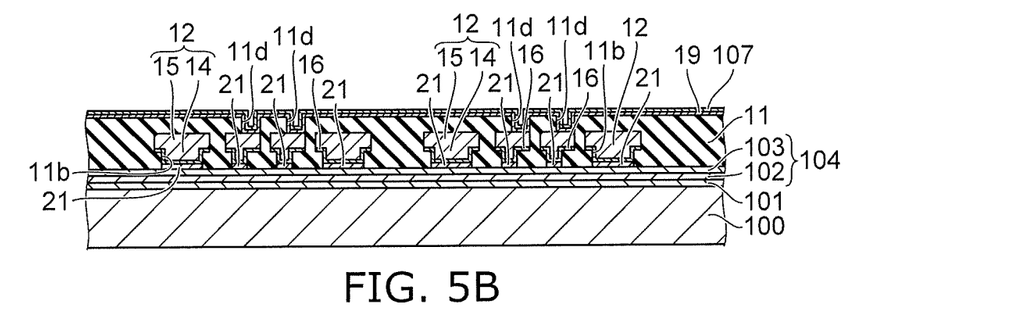

Then, as shown in FIG. 5B, for example, the titanium layer 19 is formed by depositing titanium on the entire surface by sputtering. Then, for example, a copper layer 107 is formed by depositing copper on the entire surface by sputtering. The titanium layer 19 and the copper layer 107 are formed to be continuous on the upper surface of the insulating layer 11 and on the inner surfaces of the via holes 11d.

Figure 5C:
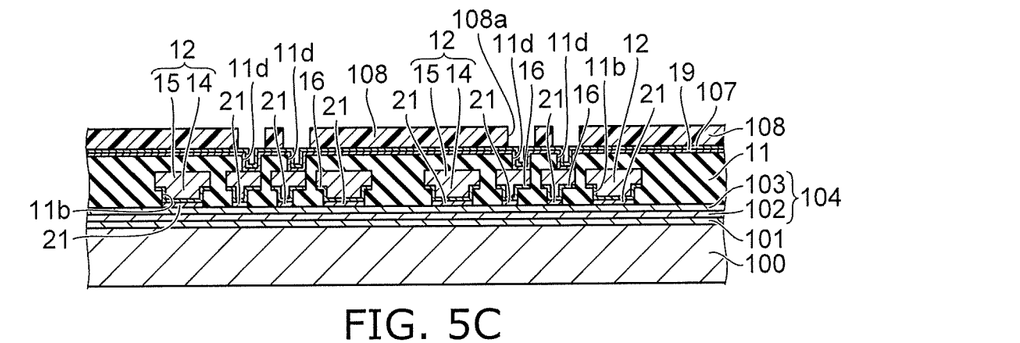

Continuing as shown in FIG. 5C, a resist pattern 108 is formed on the copper layer 107. Openings 108a are formed in the resist pattern 108 by lithography. The via holes 11d are positioned at the bottom surfaces of the openings 108a. Thereby, the openings 108a communicate with the via holes 11d.

Figure 5D:
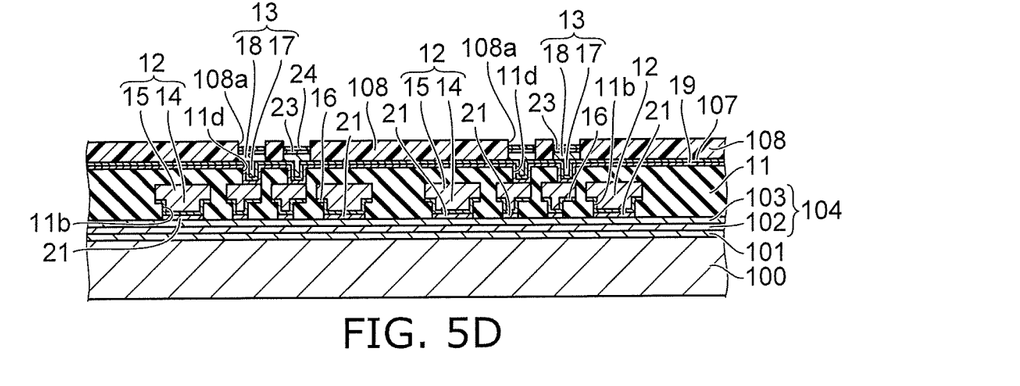

Then, as shown in FIG. 5D and FIG. 10, the upper conductive member 13 is formed by electroplating copper via the copper layer 107. The portion of the upper conductive member 13 filled into the via hole 11d is used to form the via 17; and the portion of the upper conductive member 13 filled into the opening 108a is used to form the electrode 18. The via 17 is connected to the interconnect 15 via the titanium layer 19. Then, the nickel layer 23 is formed on the electrode 18 of the upper conductive member 13 by electroplating nickel via the copper layer 107 and the upper conductive member 13. Then, displacement plating of a noble metal, e.g., gold is performed on the nickel layer 23. Thereby, a portion of the nickel is eluted from the nickel layer 23; and the gold precipitates. As a result, the gold layer 24 is formed on the upper surface of the nickel layer 23.

Figure 6A:
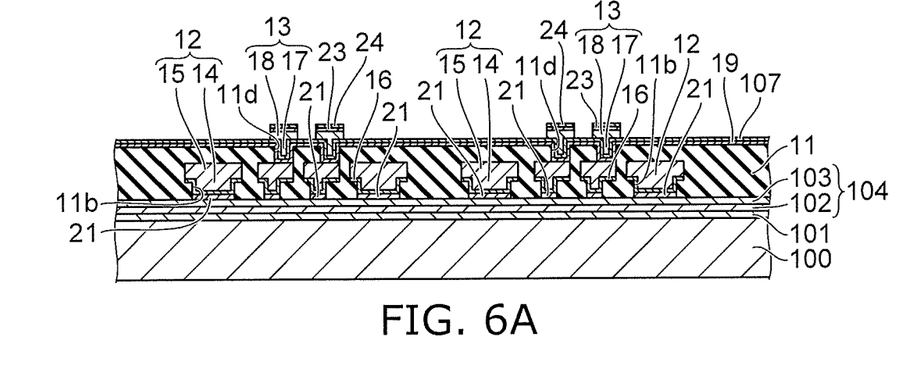

Continuing as shown in FIG. 6A and FIG. 10, the resist pattern 108 (referring to FIG. 5D) is removed. Thereby, the portion of the copper layer 107 covered with the resist pattern 108 is exposed. Also, the electrode 18, the nickel layer 23, and the gold layer 24 protrude from the upper surface of the insulating layer 11.

Figure 6B:
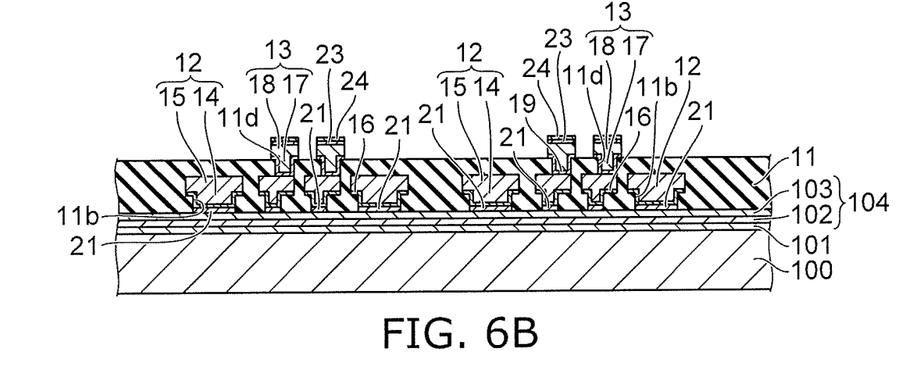

Then, as shown in FIG. 6B and FIG. 10, for example, the portions of the copper layer 107 and the titanium layer 19 not covered with the upper conductive member 13 are removed by etching. As a result, the insulating layer 11 is exposed again. On the other hand, the portions of the copper layer 107 and the titanium layer 19 covered with the upper conductive member 13 remain. The portion of the copper layer 107 covered with the upper conductive member 13 is formed as one body with the upper conductive member 13 and therefore is shown as a portion of the upper conductive member 13 hereinbelow.

Figure 6C:
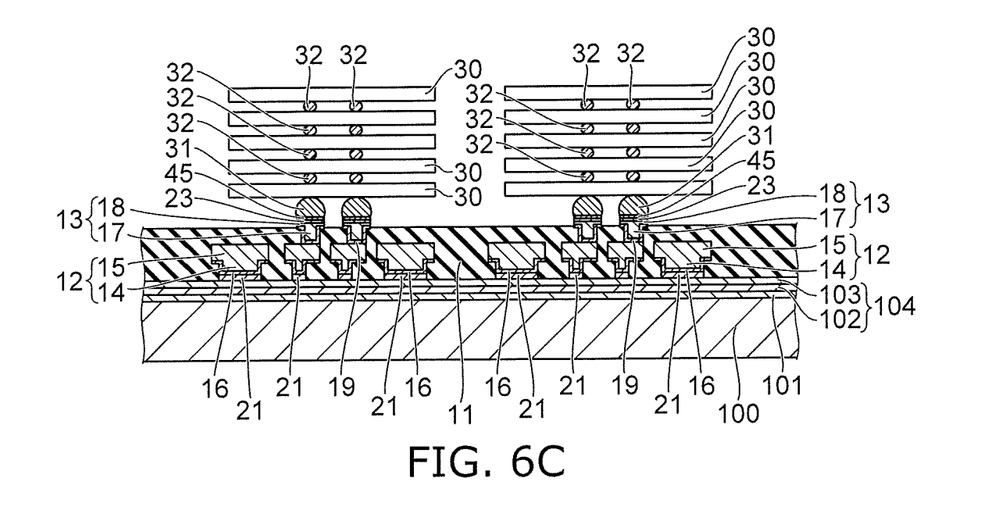

Continuing as shown in FIG. 6C, the semiconductor chip 30 is bonded on the nickel layer 23 via the micro-bump 31. At this time, the gold layer 24 is consumed by diffusing into the micro-bump 31; and the intermetallic compound layer 45 (referring to FIG. 2) is newly formed and includes copper, tin, and nickel as major components. Then, the multiple semiconductor chips 30 are stacked on the semiconductor chip 30 via the micro-bumps 32. Thereby, the multiple semiconductor chips 30 are stacked on the insulating layer 11. The electrodes (not illustrated) of the multiple semiconductor chips 30 are connected to the electrode 18 via the micro-bumps 32 and 31, the intermetallic compound layer 45, and the nickel layer 23. A stacked body that is made of the multiple semiconductor chips 30 pre-bonded to each other via the micro-bumps 32 may be bonded to the nickel layer 23 via the micro-bump 31.

Figure 7A:
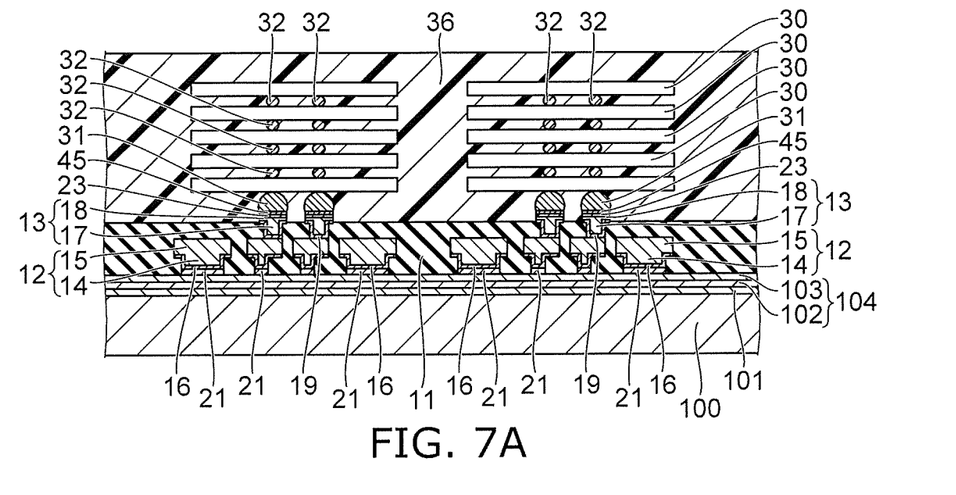

Then, as shown in FIG. 7A, a resin material is molded to cover and seal the stacked body made of the multiple semiconductor chips 30 on the insulating layer 11; for example, the resin member 36 is formed by thermal curing at a temperature of 200° C. or less.

Figure 7B:
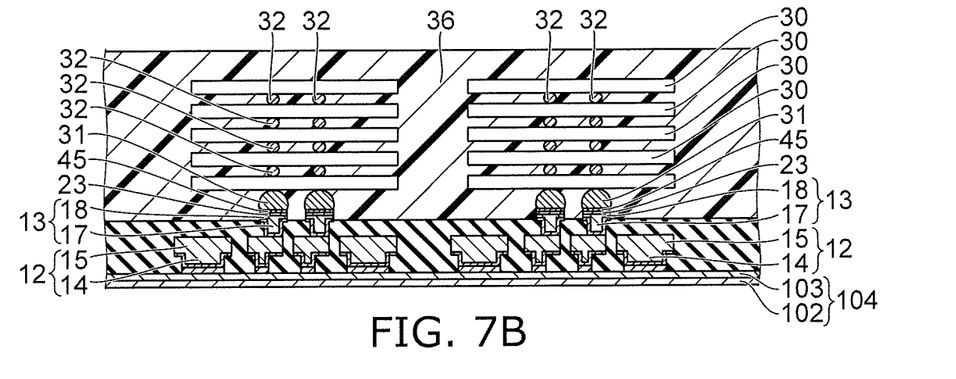

Continuing as shown in FIG. 7B, for example, the release layer 101 is removed by dissolving using a chemical liquid or by decomposing by light irradiation. Or, the support substrate 100 is peeled from the release layer 101 using a force exceeding the adhesion force of the release layer 101. Thereby, the support substrate 100 is removed; and the seed layer 104 is exposed.

Figure 7C:
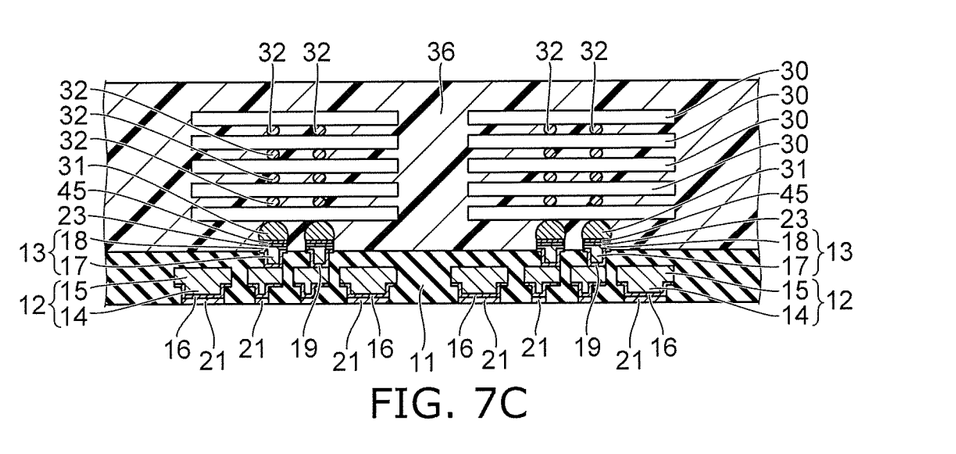

Then, as shown in FIG. 7C, residue (not illustrated) of the release layer 101 remaining on the seed layer 104 is removed. Then, for example, the seed layer 104 is removed by wet etching. Thereby, the insulating layer 11 and the nickel layer 21 are exposed.

Figure 8A:
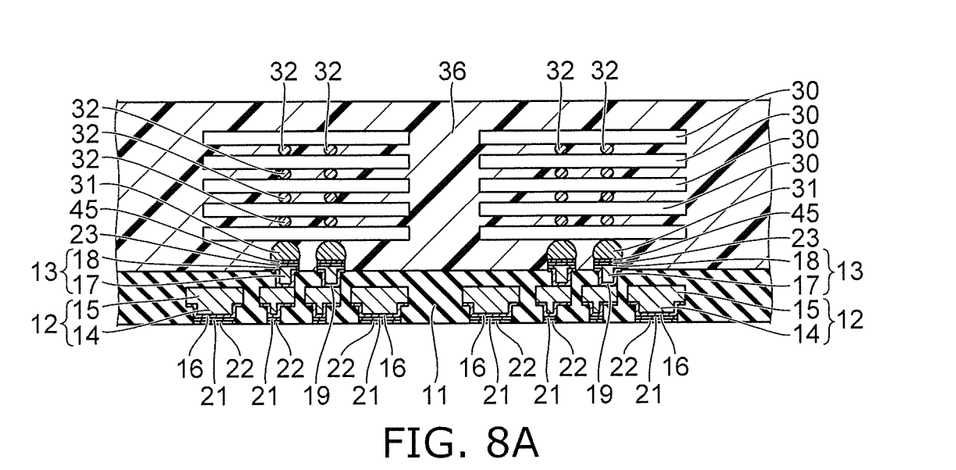

Continuing as shown in FIG. 8A and FIG. 10, displacement plating of a noble metal, e.g., gold is performed. Thereby, a portion of the nickel is eluted from the nickel layer 21; and the gold precipitates. As a result, the gold layer 22 is formed on the lower surface of the nickel layer 21. The redistribution layer 10 is formed by the processes recited above.

Figure 8B:
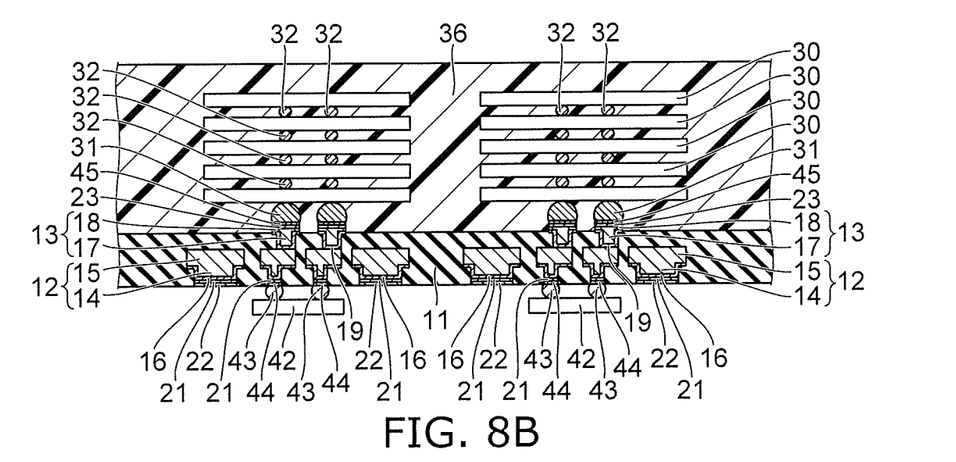

Then, as shown in FIG. 8B and FIG. 10, the control chip 42 is bonded to a portion of the gold layer 22 via the micro-bump 43. At this time, the gold layer 22 is diffused into the micro-bump 43 by the heating of the bonding; and the gold layer 22 is consumed. Also, the intermetallic compound layer 44 is formed between the nickel layer 21 and the micro-bump 43 and includes copper, tin, and nickel as major components. A resin member may be formed to cover the micro-bump 43 between the redistribution layer 10 and the control chip 42.

Figure 8C:
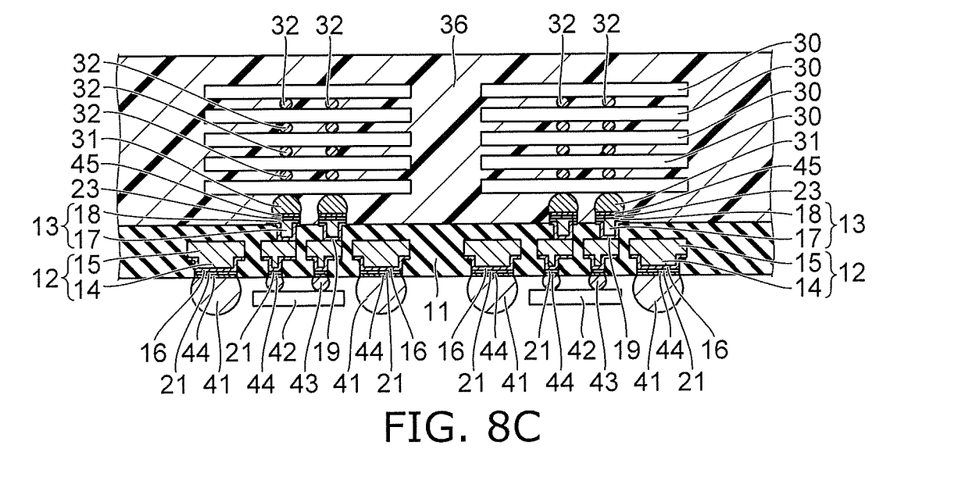

Continuing as shown in FIG. 8C and FIG. 10, the bump 41 that is made of, for example, solder is bonded to the gold layer 22 to which the micro-bump 43 is not bonded. At this time as well, the gold layer 22 is diffused into the bump 41 by the heating of the bonding; and the gold layer 22 is consumed. Also, the intermetallic compound layer 44 is formed between the nickel layer 21 and the bump 41 and includes copper, tin, and nickel as major components.

Figure 9:
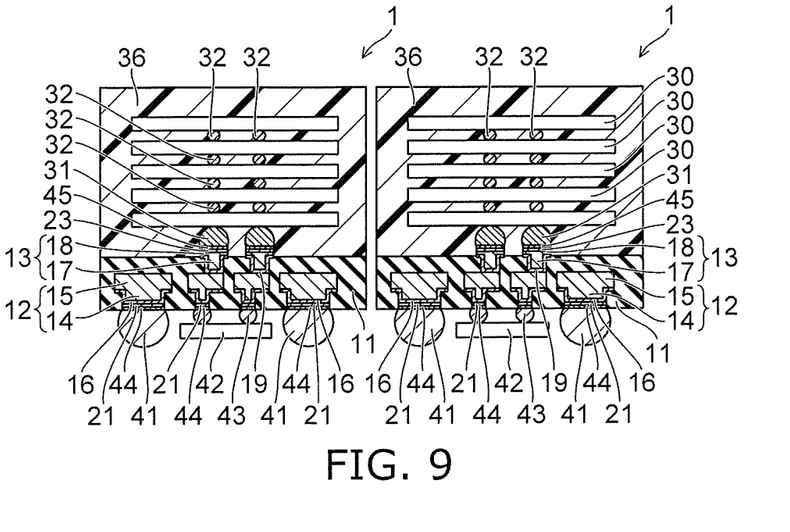

Then, as shown in FIG. 9, dicing is performed; and the redistribution layer 10 and the resin member 36 are cut. Thereby, the multiple semiconductor devices 1 are manufactured. The configuration of the semiconductor device 1 is as shown in FIG. 1 and FIG. 2.

Effects of the embodiment will now be described.

In the embodiment, in the processes shown in FIG. 3A to FIG. 7A, a structure body that is made of the insulating layer 11, the semiconductor chip 30, the resin member 36, etc., is formed on the support substrate 100; subsequently, the support substrate 100 is removed in the process shown in FIG. 7B. Also, the gold layer 22, the bump 41, etc., are formed in the processes shown in FIG. 7C to FIG. 8C. Thereby, the semiconductor chip 30 can be connected to the bump 41 by the redistribution layer 10. As a result, a thinner semiconductor device 1 can be realized compared to the case where a printed circuit board is used.

When the support substrate 100 is removed in the process shown in FIG. 7B, there are cases where warp occurs in the structure body made of the insulating layer 11, the semiconductor chip 30, the resin member 36, etc., mainly due to the stress occurring in the semiconductor chips 30 and the stress when thermally curing the resin member 36. When the warp occurs, stress is generated between the insulating layer 11 and the lower conductive member 12 and between the insulating layer 11 and the upper conductive member 13. The insulating layer 11 is made of an organic material, and the lower conductive member 12 and the upper conductive member 13 are made of copper; but because the adhesion between copper and the organic material is poor, there is a possibility that peeling at the interface may occur if the insulating layer 11 and the lower conductive member 12 are in direct contact. Similarly, there is a possibility that peeling at the interface may occur if the insulating layer 11 and the upper conductive member 13 are in direct contact.

Therefore, in the embodiment, the titanium layer 16 is provided between the insulating layer 11 and the lower conductive member 12; and the titanium layer 19 is provided between the insulating layer 11 and the upper conductive member 13. Because the adhesion between titanium and the organic material is high, the peeling of the lower conductive member 12 and the upper conductive member 13 from the insulating layer 11 can be suppressed by providing the titanium layers 16 and 19.

Although the materials of the lower conductive member 12 and the upper conductive member 13 are not limited to copper, it is favorable to use a material having high conductivity to suppress the resistance between the bump 41 and the semiconductor chip 30. Also, although an example is shown in the embodiment in which the titanium layers 16 and 19 are provided as the conductive layer, this is not limited thereto; and a layer that is made of another material may be provided. However, it is favorable for the adhesion between the organic material and the material of the conductive layer to be high. Generally speaking, it is favorable for the materials of the lower conductive member 12 and the upper conductive member 13 to have lower resistivities than the material of the conductive layer, and for the adhesion with the organic material to be higher for the material of the conductive layer than for the materials of the lower conductive member 12 and the upper conductive member 13. Based on experience, there is a tendency for the adhesion with organic materials to be higher for metals having higher melting points; therefore, for example, the material of the adhesion layer can be a metal material having a higher melting point than copper.

Further, in the embodiment, the nickel layer 21 is formed by electroplating in the process shown in FIG. 3C; and the gold layer 22 is formed by displacement plating in the process shown in FIG. 8A. Thereby, the nickel layer 21 and the gold layer 22 are not formed on the lower surface of the insulating layer 11; and shorts between the vias 14 can be suppressed.

According to the embodiments described above, a semiconductor device and a method for manufacturing the semiconductor device can be realized in which the adhesion between the insulating layer and the conductive member is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a redistribution layer;
   a bump bonded to a first surface of the redistribution layer; and
   a chip bonded to a second surface of the redistribution layer, the second surface being opposite side of the first surface,
   the redistribution layer including
      an insulating layer,
      a conductive member connecting the bump to the chip and being provided inside the insulating layer,
      a bonding electrode connected between the conductive member and the bump, the bonding electrode being provided inside the insulating layer, and
      a conductive layer provided between the insulating layer and the conductive member and between the bonding electrode and the conductive member,
   the conductive member including:
      a first via connected to the bump,
      a second via connected to the chip, and
      an interconnect connected between the first via and the second via;
   the conductive layer being disposed at least on a lower surface of the first via, on a side surface of the first via, and on a lower surface of the interconnect,
   the first via being connected to the bonding electrode via the conductive layer,
   a structure body and the bonding electrode coinciding with each other when viewed from the first surface side, the structure body formed of the first via and a portion of the conductive layer disposed on the side surface of the first via,
   no step being provided at a boundary between the conductive layer and the bonding electrode, the boundary between the conductive layer and the bonding electrode being located inside the insulating layer, and
   a resistivity of the conductive member being lower than a resistivity of the conductive layer.

2. The device according to claim 1, wherein
   the insulating layer includes an organic material,
   the conductive member includes copper,
   the conductive layer includes titanium, and
   the bonding electrode includes nickel.

3. The device according to claim 1, wherein
   the conductive layer is disposed also on a lower surface of the second via and on a side surface of the second via, and the second via is connected to the interconnect via the conductive layer.

4. The device according to claim 1, further comprising:
another chip provided on the chip and connected to the conductive member via the chip; and
a resin member covering the chip and the other chip and being provided on the second surface.

5. The device according to claim 1, further comprising a control chip bonded to the first surface and connected to the conductive member.

* * * * *